US006749984B2

(12) United States Patent
Kawauchi

(10) Patent No.: US 6,749,984 B2
(45) Date of Patent: Jun. 15, 2004

(54) PLANOGRAPHIC PRINTING PLATE PRECURSOR

(75) Inventor: Ikuo Kawauchi, Shizuoka-ken (JP)

(73) Assignee: Fuji Photo Film Co., Ltd., Minami-Ashigara (JP)

( * ) Notice: Subject to any disclaimer, the term of this patent is extended or adjusted under 35 U.S.C. 154(b) by 97 days.

(21) Appl. No.: 09/835,564

(22) Filed: Apr. 17, 2001

(65) Prior Publication Data

US 2001/0039895 A1 Nov. 15, 2001

(30) Foreign Application Priority Data

Apr. 18, 2000 (JP) ....................................... 2000-116656

(51) Int. Cl.[7] .................................................. G03F 7/00
(52) U.S. Cl. ..................... 430/270.1; 430/302; 430/303
(58) Field of Search ............................. 430/270.1, 302, 430/303

(56) References Cited

U.S. PATENT DOCUMENTS

| | | | | | |
|---|---|---|---|---|---|
| 4,973,572 | A | * | 11/1990 | DeBoer | 503/227 |
| 5,466,557 | A | * | 11/1995 | Haley et al. | 430/278 |
| 5,493,971 | A | * | 2/1996 | Lewis et al. | 101/454 |
| 5,814,431 | A | * | 9/1998 | Nagasaka et al. | 430/281.1 |
| 5,972,556 | A | * | 10/1999 | Leenenders | 430/200 |
| 6,030,748 | A | * | 2/2000 | Nishimiya et al. | 430/271.1 |
| 6,074,802 | A | * | 6/2000 | Murata et al. | 430/270.1 |
| 6,110,646 | A | * | 8/2000 | Urano et al. | 430/302 |
| 6,152,036 | A | * | 11/2000 | Verschueren et al. | 101/457 |
| 6,200,727 | B1 | * | 3/2001 | Urano et al. | 430/270.1 |
| 6,261,740 | B1 | * | 7/2001 | Nguyen et al. | 430/271.1 |
| 6,294,311 | B1 | * | 9/2001 | Shimazu et al. | 430/271.1 |
| 6,309,792 | B1 | * | 10/2001 | Hauck et al. | 430/270.1 |
| 6,342,335 | B1 | * | 1/2002 | Fujita et al. | 430/270.1 |
| 6,358,669 | B1 | * | 3/2002 | Saviar-Hauck et al. | 430/273.1 |
| 6,410,207 | B1 | * | 6/2002 | Nagasaka et al. | 430/302 |
| 6,455,224 | B1 | * | 9/2002 | Oohashi et al. | 430/270.1 |
| 2002/0048722 | A1 | * | 4/2002 | Aoshima | 430/270.1 |
| 2002/0142247 | A1 | * | 10/2002 | Kawamura et al. | 430/270.1 |
| 2002/0172874 | A1 | * | 11/2002 | Horne et al. | 430/14 |

FOREIGN PATENT DOCUMENTS

| | | | |
|---|---|---|---|
| EP | 0 901 902 | A2 | 3/1999 |
| WO | 97/39894 | A1 | 10/1997 |
| WO | 99/11458 | A1 | 3/1999 |

* cited by examiner

*Primary Examiner*—Mark F. Huff
*Assistant Examiner*—Amanda Walke
(74) *Attorney, Agent, or Firm*—Burns, Doane, Swecker & Mathis, L.L.P.

(57) ABSTRACT

A planographic printing plate precursor includes a photosensitive layer obtained by coating and drying on a support a photosensitive layer coating solution formed of a photosensitive composition, which contains a cyanine dye represented by general formula (I) below and a polymer insoluble in water and soluble in an aqueous alkali solution, dissolved or dispersed in a solvent system containing 80% by weight or more of a solvent having a boiling point lower than 100° C. in a solvent having a boiling point lower than 200° C.; wherein a solubility in an aqueous alkali solution of the photosensitive layer is increased by exposure to an infrared laser.

General formula (I)

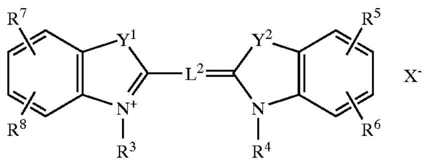

4 Claims, No Drawings

PLANOGRAPHIC PRINTING PLATE PRECURSOR

BACKGROUND OF THE INVENTION

1. Field of the Invention

The present invention relates to a positive-type planographic printing plate precursor, and more particularly to a positive-type planographic printing plate precursor that can be written by heat from an infrared laser, a thermal head or the like, and used for so-called direct plate-making in which a plate can be made directly from digital signals from a computer, or the like.

2. Description of the Related Art

In recent years, as advances have been made in solid state lasers and semiconductor lasers having a light emission range in the near infrared to infrared range, attention has been focused on systems that employ these infrared lasers for direct plate-making from computer digital data.

A positive-type planographic printing plate material to be used with an infrared laser for direct plate making is disclosed in Japanese Patent Application Laid-Open (JP-A) No. 7-285275. This invention is an image recording material which is produced by adding a substance which absorbs light and generates heat, and a positive-type photosensitive compound such as a quinonediazide compound, or the like, to a resin soluble in an aqueous alkali solution. In the image portion of the image recording material, the positive-type photosensitive compound works as a dissolution inhibitor to substantially lower the solubility of the resin soluble in an aqueous alkali solution. In the non-image portion of the image recording material, this positive-type photosensitive compound is rendered incapable of inhibiting dissolution by being decomposed by heat, and can be removed by development to thereby form an image.

The present inventors have found through examination that positive images can be obtained even when the quinonediazide compound is not added to an image recording material. However, the image recording material which is produced simply without the quinonediazide compound has a drawback in that stability of sensitivity thereof with respect to concentration of a developing solution, i.e., development latitude thereof, is poor. The development latitude used herein refers to a latitude within which good images can be formed when an alkali concentration in the alkaline developing solution is changed.

On the other hand, onium salts and alkali-insoluble hydrogen-bondable compounds are known to have an alkali dissolution-inhibiting action on alkali-soluble polymers. Particularly, with the image forming materials that are used with an infrared laser and disclosed in JP-A No. 10-268512, JP-A No. 11-44956, WO 98/42507, WO 99/1795 and WO 99/11458, it is known that a good positive action is obtained by employing a cyanine dye in a photosensitive composition, whereby discrimination between an image portion and a non-image portion in imaging is improved. The positive action is an action in which an infrared absorbing colorant absorbs laser light, and the heat thus generated eliminates the dissolution inhibiting effect of the polymer film in the irradiated portion to form an image.

These positive-type imaging materials are superior in image formability. However, it has been found that developing properties thereof largely vary depending on drying conditions at the time a photosensitive layer coating solution is coated and dried to form a photosensitive layer. That is, there has been the problem that developing properties of planographic printing plates provided with the same photosensitive layers largely vary by changing only a thickness of the aluminum substrate which is a hydrophilic support, and therefore stable plate-making cannot be carried out with such planographic printing plates. That is, when the thickness of the support is changed in order to improve the support's ability to be accommodated to a printer or the like, it becomes impossible to obtain the desired planographic printing plate due to variation in the developing properties thereof, and it becomes necessary to select appropriate exposure and developing conditions. This creates problems in that, not only does processing of the planographic printing plates become complicated, but significant losses in time and costs can occur.

SUMMARY OF THE INVENTION

An object of the present invention is to provide a positive-type planographic printing plate precursor which has high sensitivity, is superior in image formability and has a good developing stability in that the sensitivity does not vary even when a thickness of the support is changed.

The present inventors have found through examination that the variation of developing properties can be prevented by selecting a solvent used in forming a photosensitive layer and a cyanine dye as a light-heat converting agent.

A first aspect of the present invention is a positive-type planographic printing plate precursor including a photosensitive layer which is obtained by coating and drying on a support a photosensitive layer coating solution formed by a photosensitive composition containing a cyanine dye represented in the following general formula (I) and a polymer insoluble in water and soluble in an aqueous alkali solution which are dissolved or dispersed in a solvent system containing 80% by weight or more of a solvent having a boiling point lower than 100° C. in a solvent having a boiling point lower than 200° C.; and solubility in an aqueous alkali solution of the photosensitive layer is enhanced by an exposure to an infrared laser:

General formula (I)

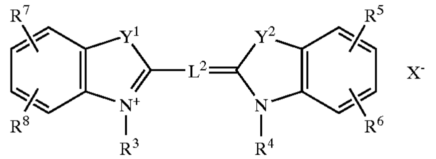

wherein, each of $Y^1$ and $Y^2$ represents a dialkylmethylene group or a sulfur atom; each of $R^3$ and $R^4$ represents an alkyl group, alkenyl group, alkynyl group or phenyl group which may be substituted; $L^2$ represents a trimethine group, pentamethine group or heptamethine group which may be substituted, and two substituents of the pentamethine group or the heptamethine group may be combined with each other to form a cycloalkene ring having 5 to 7 carbon atoms; each of $R^5$ through $R^8$ represents a hydrogen atom or an alkyl group, alkenyl group, alkoxy group, cycloalkyl group or aryl group which may be substituted, and $R^5$ and $R^6$, and $R^7$ and $R^8$ may be respectively combined with each other to form a ring structure. $X^-$ represents an anion.

A second aspect of the present invention is a method for producing a positive-type planographic printing plate precursor including the steps of: preparing a photosensitive composition containing a cyanine dye represented in the general formula (I) and a polymer insoluble in water and soluble in an aqueous alkali solution; preparing a photosensitive layer coating solution by dissolving or dispersing the photosensitive composition in a solvent system containing 80% by weight or more of a solvent having a boiling point lower than 100° C. in a solvent having a boiling point lower than 200° C.; and coating and drying the photosensitive coating solution on a support to form a photosensitive layer.

In the step of coating and drying the photosensitive coating solution, when the thickness of the aluminum support, which has high thermal conductivity, is changed, a temperature rise, i.e., a thermal load at the photosensitive layer, largely differs, and the amount of the residual solvent in the photosensitive layer varies under the same drying conditions. Since the solvent used in the photosensitive layer coating solution has a sufficient interaction capability to dissolve components such as polymers in the photosensitive layer, the solvent remaining after the formation of the coating film causes interaction which competes with interactions between polymers as well as between polymers and an infrared absorbing agent, thereby affecting the desired interactions between the polymers as well as between the polymers and the infrared absorbing agent.

The mechanism resulting in the working of the present invention is not altogether clear. However, the mechanism is believed to be as follows. A particular cyanine dye that can form a strong interaction between the polymers used to form the coating film is used in the photosensitive layer coating solution. An amount of solvent having a relatively low boiling point is increased as the solvent used to prepare the coating solution. Therefore, variation in the amount remaining of the residual solvent is suppressed even when the thermal load varies, and the influence on the interaction between the polymers and the infrared absorbing agent caused by the solvent is suppressed, whereby suppression of variation in developing properties can be achieved.

DESCRIPTION OF THE PREFERRED EMBODIMENTS

A photosensitive layer of a planographic printing plate precursor of the present invention contains a cyanine dye represented by general formula (I) shown above and a polymer which is insoluble in water and soluble in an aqueous alkali solution (hereinafter also referred to as aqueous alkali solution-soluble polymer), and the photosensitive layer is formed by coating and drying, on a support, a photosensitive layer coating solution formed of a photosensitive composition, containing these components, dissolved or dispersed in a solvent system containing 80% by weight or more of a solvent having a boiling point lower than 100° C.

In general formula (I) shown above, each of $Y^1$ and $Y^2$ represents a dialkylmethylene group or a sulfur atom.

As alkyl groups in the dialkylmethylene group, those having about 1 to 12 carbon atoms are preferable, and two alkyl groups may be the same or different.

Each of $R^3$ and $R^4$ represents an alkyl group (preferably one having 1 to 12 carbon atoms), alkenyl group (preferably one having 2 to 12 carbon atoms), alkynyl group (preferably one having 2 to 12 carbon atoms) or phenyl group (preferably one having 6 to 12 carbon atoms) which may be substituted. When these groups be substituted, examples of the substituents include a halogen atom, a carbonyl group, nitro group, nitrile group, sulfonyl group, carboxyl group, carboxylate, sulfonate, and the like.

$L^2$ represents a trimethine group, pentamethine group or heptamethine group which may be substituted, and two substituents of the pentamethine group or the heptamethine group may be combined with each other to form a cycloalkene ring having 5 to 7 carbon atoms. When $L^2$ has substituents, examples of the substituents include a halogen atom, an alkyl group having 1 to 8 carbon atoms, and the like.

Each of $R^5$ through $R^8$ represents a hydrogen atom, or an alkyl group (preferably one having 1 to 12 carbon atoms), alkenyl group (preferably one having 2 to 12 carbon atoms), alkoxy group (preferably one having 1 to 12 carbon atoms), cycloalkyl group (preferably one having 3 to 12 carbon atoms) or aryl group (preferably one having 6 to 12 carbon atoms) which may be substituted, and $R^5$ and $R^6$, and $R^7$ and $R^8$ may be combined with each other to form a ring structure. Specific examples of $R^5$ through $R^8$ include a hydrogen atom, a methyl group, ethyl group, phenyl group, dodecyl group, naphthyl group, vinyl group, allyl group, cyclohexyl group, and the like. When these groups be substituted, examples of the substituents include a halogen atom, a carbonyl group, nitro group, nitrile group, sulfonyl group, carboxyl group, carboxylate, sulfonate, and the like.

$X^-$ represents an anion. When $R^3$ through $R^8$ have anionic substituents, $X^-$ may not be present.

Specific examples of cyanine dyes represented by general formula (I) are shown below, however, these examples are not intended to limit the present invention.

(1)

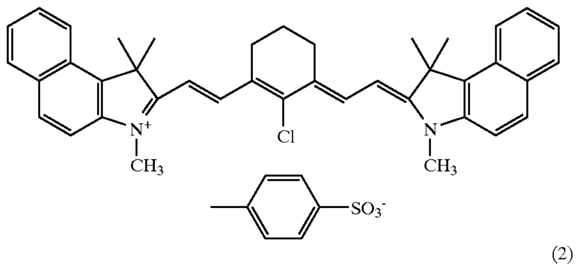

(2)

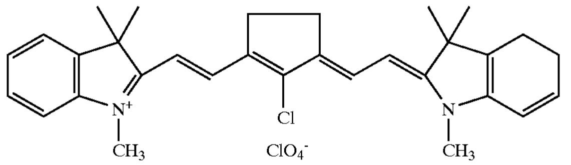

(3)

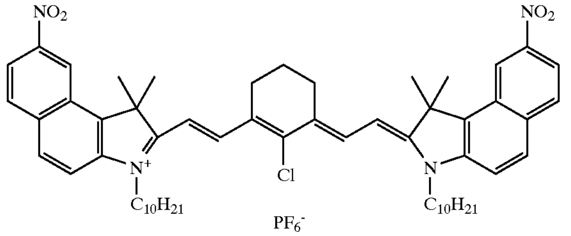

(4)

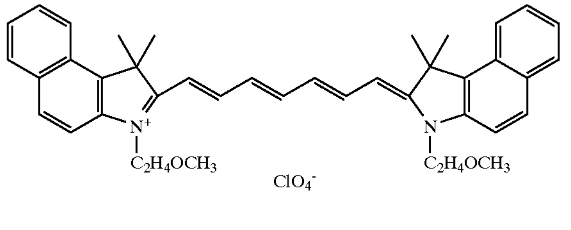

-continued (5)

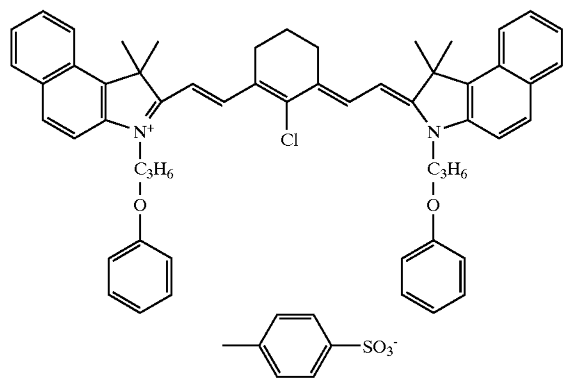

An amount of the cyanine dye in the composition forming the photosensitive layer is preferably 1 to 20% by weight of total solids.

Further, a known light-heat converting agent described later may also be used in the photosensitive layer relating to the present invention as long as it does not impair the effects of the present invention.

Next, a solvent system used in forming the photosensitive layer of the planographic printing plate precursor of the present invention is described. A coating solution solvent is required to contain 80% by weight or more of a solvent having a boiling point lower than 100° C. in a solvent having a boiling point lower than 200° C., preferably contains 90% by weight or more, and more preferably contains 100% solvent having a boiling point lower than 100° C.

Examples of the solvent having the boiling point lower than 100° C. used in the photosensitive layer coating solution of the present invention are as follows, but they do not limit the present invention. In the (round brackets), a typical boiling point (° C.) is given. Examples include alcohols such as methanol (65.0), ethanol (78.5), n-propanol (97.3), isopropanol (82.3), and the like; ethers such as tetrahydrofuran (66), dioxolane (74), methyl dioxolane (81), and the like; ketones such as acetone (56), methyl ethyl ketone (79.6), and the like; esters such as ethyl acetate (77), isopropyl acetate (88.7), and the like; hydrocarbons such as n-hexane (68.7), cyclohexane (80.7), n-heptane (98.4), and the like.

Among these solvents, methanol, ethanol, methyl ethyl ketone, ethyl acetate, and the like are preferable.

Further, those solvents having a boiling point higher than or equal to 100° C. can also be preferably used in the solvent system used in the present invention by combining a predetermined amount of them with those having the boiling point lower than 100° C. Examples of the solvents having the boiling point higher than or equal to 100° C. which can be used in combination with the solvents having the boiling point lower than 100° C. are as follows: alcohols such as n-butanol (117.7), isobutanol (108.3), 2-methyl-2-butanol (101.8), 2-ethyl-2-butanol (147), 2,4-dimethyl-3-pentanol (140), n-hexanol (160), cyclohexanol (161.1), 1-octanol (195.2), and the like; ethers such as 3-methoxy-3-methylbutanol (174), 1-methoxy-2-propanol (120.6), dipropylene glycol monomethyl ether (190), tripropylene glycol monomethyl ether (243), propylene glycol monobutyl ether (170.2), propylene glycol monomethyl acetate (146), methyl carbitol (193.6), ethyl carbitol (202.8), and the like; ketones such as methyl propyl ketone (192), methyl isobutyl ketone (115.1), methyl amyl ketone (151), diethyl ketone (102.8), 3-hydroxy-2-butanone (148), 4-hydroxy-2-butanone (182), cyclopentanone (129), cyclohexanone (155.4), diacetone alcohol (169.2), and the like; esters such as methyl lactate (144.8), ethyl lactate (157), butyl lactate (188), n-propyl acetate (102), n-butyl acetate (126.6), methyl butyrate (102.3), ethyl butyrate (120), butyl butyrate (166.4), -butyrolactone (206), and the like; hydrocarbons such as n-octane (125.7), toluene (110.6), xylene (139), and the like; and others such as water (100), dimethy diglycol (162), and the like.

These solvents are used singly or in combination thereof. The solvent to be used is selected in consideration of the solubility, dispersibility, and the like, of the components used in the photosensitive composition, and the composition is dissolved or dispersed in a suitable solvent at a suitable concentration to prepare the photosensitive layer coating solution. At this time, ratio of the solvent having the boiling point lower than 100° C. in the solvent system is required to adjust so that it does not become less than 80% by weight.

Concentration of the coating solution is not particularly limited, but typical concentration of solids thereof is within a range of 2 to 50% by weight.

The photosensitive layer coating solution is coated onto the support and dried to form a photosensitive layer. The method for coating the photosensitive layer coating solution onto the support is not particularly limited, and a suitable method among conventionally known methods in the art can be selected and carried out. For example, rotational coating, wire bar coating, dip coating, air knife coating, roll coating, blade coating, curtain coating, and the like, can be used.

The amount of the coated photosensitive layer may influence mainly sensitivity of the photosensitive layer, developing properties, strength and printing resistance of an exposed coating, and is desirable to be selected depending on application. If the amount of the coating is too small, printing resistance is not satisfactory. On the other hand, if the amount of the coating is too large, sensitivity is lowered, exposure takes a long time and development requires a longer time. Therefore, neither is preferable. The amount of the coating of the photosensitive layer of the planographic printing plate precursor usable with an infrared laser exposure of the present invention is within a range of 0.1 to 7 $g/cm^2$, preferably 0.2 to 5 $g/cm^2$, and more preferably 0.5 to 3 $g/cm^2$ in dry weight.

Drying temperature of the photosensitive layer coating solution after it has been coated is preferably 60° C. to less than 250° C., more preferably 80° C. to less than 200° C., and most preferably 90° C. to less than 180° C. Drying time is preferably 20 seconds to less than 5 minutes, more preferably 25 seconds to less than 4 minutes, and most preferably 30 seconds to less than 3 minutes.

If the drying temperature is lower than 60° C. or the drying time is less than 20 seconds, an amount of a residual solvent may be large and sensitively may be lowered. To raise the coating temperature to 250° C. or higher, or to extend the drying time to 5 minutes or longer does not decrease the amount of the residual solvent as much as it is expected from an energy consumption. Since the positive-type photosensitive layer of the present invention does not contain components which are likely to deteriorate especially by heating, heating at a known drying temperature or a drying time up to the upper limit does not cause particular problems.

In the present invention, ratio of the solvent having the boiling point lower than 100° C. in the solvent having the boiling point lower than 200° C. in the residual solvent contained in the photosensitive layer thus formed is preferably 50% by weight or more, and more preferably 70% by weight or more.

The amount of the residual solvent is preferably measured by gas chromatograph method in terms of accuracy of measurement, however only solvents having a boiling point lower than 220° C. are accurately detected among the solvents because of other components contained in the photosensitive layer. However, as can be seen from the examples of the coating solvent listed above, normally, a high-boiling solvent having a boiling point higher than or equal to 220° C. is rarely used. Therefore, in the present invention, a ratio of the solvent having the boiling point lower than 100° C. in the solvent having the boiling point lower than 200° C. in the residual solvent is measured as a criterion for judgement. If the ratio of the solvent having the boiling point lower than 100° C. in the residual solvent is less than 50% by weight, and particularly when a thick support is used, developing properties are likely to deteriorate due to the influence of the remaining high-boiling solvent, and this is not preferable.

Next, the photosensitive layer of the planographic printing plate precursor of the present invention is described.

[Polymer Compound Insoluble in Water and Soluble in an Aqueous Alkali Solution]

The polymer insoluble in water and soluble in an aqueous alkali solution, which is a major component forming the photosensitive layer of the planographic printing plate precursor of the present invention, refers to a polymer having acid groups such as listed below on a main chain or side chains thereof.

Examples of the acid groups include a phenolic hydroxide group (—Ar—OH), carboxylic acid group (—$CO_3H$), sulfonic acid group (—$SO_3H$), phosphoric acid group (—OPO3H), sulfonamide group (—SO2NH—R), and substituted sulfonamide type acid groups (active imide groups) (—$SO_2NHCOR$, —$SO_2NHSO_2R$, —$CONHSO_2R$), wherein Ar represents a divalent aryl group which may be substituted, and R represents a hydrocarbon group which may be substituted.

Among these, preferable acid groups include (a-1) phenolic hydroxyl group, (a-2) sulfonamide group, and (a-3) active imide group, and particularly an aqueous alkali solution-soluble resin having (a-1) phenolic hydroxyl group (hereinafter referred to as "resin having a phenolic hydroxyl group") can be most preferably used.

Examples of the polymer having (a-1) phenolic hydroxyl group include novolak resins such as a polycondensate of phenol and formaldehyde (hereinafter referred to as "phenol formaldehyde resin"), a polycondensate of m-cresol and formaldehyde (hereinafter referred to as "m-cresol formaldehyde resin"), a polycondensate of p-cresol and formaldehyde, a polycondensate of mixed m- and p-cresol and formaldehyde, and a polycondensate of phenol, cresol (m-, p-, or mixture of m- and p-) and formaldehyde; and a polycondensate of pyrogallol and acetone. Alternatively, copolymers obtained by copolymerizing monomers having phenol groups in their side chains can also be used. The monomers having phenol groups include acrylamide, methacrylamide, acrylate, methacrylate, and hydroxy styrene, which have phenol groups.

Specifically, N-(2-hydroxyphenyl) acrylamide, N-(3-hydroxyphenyl) acrylamide, N-(4-hydroxyphenyl) acrylamide, N-(2-hydroxyphenyl) methacrylamide, N-(3-hydroxyphenyl) methacrylamide, N-(4-hydroxyphenyl) methacrylamide, o-hydroxyphenyl acrylate, m-hydroxyphenyl acrylate, p-hydroxyphenyl acrylate, o-hydroxyphenyl methacrylate, m-hydroxyphenyl methacrylate, p-hydroxyphenyl methacrylate, o-hydroxystyrene, m-hydroxystyrene, p-hydroxystyrene, 2-(2-hydroxyphenyl) ethylacrylate, 2-(3-hydroxyphenyl) ethylacrylate, 2-(4-hydroxyphenyl) ethylacrylate, 2-(2-hydroxyphenyl) ethylmethacrylate, 2-(3-hydroxyphenyl) ethylmethacrylate, 2-(4-hydroxyphenyl) ethylmethacrylate, 2-(N'-(4-hydroxyphenyl) ureido) ethylacrylate, 2-(N'-(4-hydroxyphenyl) ureido) ethylmethacrylate, or the like, can be preferably used.

In terms of image formability, those polymers having weight average molecular weight of $5.0\times10^2$ to $2.0\times10^5$ and number average molecular weight of $2.0\times10^2$ to $1.0\times10^5$ are preferable. Further, these resins may be used singly or in combination thereof. When they are used in combination, polycondensates of phenol having an alkyl group having 3 to 8 carbon atoms as a substituent and formaldehyde, such as a polycondensate of t-butylphenol and formaldehyde and a polycondensate of octylphenol and formaldehyde, as described in U.S. Pat. No. 4,123,279, may be used in combination.

Further, as described in U.S. Pat. No. 4,123,279, condensates of phenol having an alkyl group having 3 to 8 carbon atoms as a substituent and formaldehyde, such as t-butylphenol-formaldehyde resin and octylphenol-formaldehyde resin, may also be used in combination. Such resins having phenolic hydroxyl group may be used singly or in combination thereof.

In the case of an alkaline water-soluble polymer having (a-2) sulfonamide group, an exemplary monomer having (a-2) sulfonamide group, which is the main monomer forming this polymer, is a monomer formed of low molecular-weight compounds having, in each molecule thereof, one or more sulfonamide groups having at least one hydrogen atom bound to the nitrogen atom thereof and one or more polymerizable unsaturated bonds. Among these, a low molecular-weight compound having an acryloyl group, allyl group or vinyloxy group, as well as a substituted or monosubstituted aminosulfonyl group or substituted sulfonylimino group is preferable.

Examples of such a compound includes compounds represented by the following general formulae 1 to 5:

General formula 1

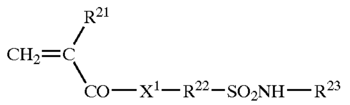

General formula 2

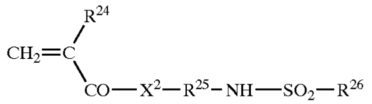

General formula 3

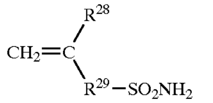

General formula 4

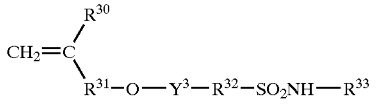

-continued

General formula 5

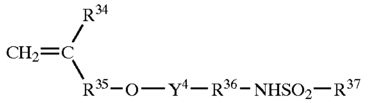

wherein, each of $X^1$ and $X^2$ represents —O— or —$NR^{17}$—. Each of $R^{21}$ and $R^{24}$ represents a hydrogen atom or —$CH^3$. Each of $R^{22}$, $R^{25}$, $R^{29}$, $R^{32}$ and $R^{36}$ represents an alkylene group, cycloalkylene group, arylene group or aralkylene group, which has 1 to 12 carbon atoms and may be substituted. Each of $R^{23}$, $R^{17}$ and $R^{33}$ represents a hydrogen atom, or an alkyl group, cycloalkyl group, aryl group or aralkyl group, which has 1 to 12 carbon atoms and may be substituted. Each of $R^{26}$ and $R^{37}$ represents an alkyl group, cycloalkyl group, aryl group or aralkyl group, which has 1 to 12 carbon atoms and may be substituted. Each of $R^{28}$, $R^{30}$ and $R^{34}$ represents a hydrogen atom or —$CH_3$. Each of $R^{31}$ and $R^{35}$ represents a single bond or an alkylene group, cycloalkylene group, arylene group or aralkylene group, which has 1 to 12 carbon atoms and may be substituted. Each of $Y^1$ and $Y^2$ represents a single bond or —CO—.

Specifically, m-aminosulfonyl phenyl methacrylate, N-(p-aminosulfonyl phenyl) methacrylamide, N-(p-aminosulfonyl phenyl) acrylamide, and the like, can be preferably used.

In the case of an alkaline water-soluble polymer having (a-3) active imide group, the polymer has the active imide group represented by the formula below in a molecule thereof, and an exemplary monomer having (a-3) active imide group, which is the main monomer forming the polymer, is a monomer formed of low molecular-weight compounds having, in each molecule thereof, one or more active imide groups represented by the formula below and one or more polymerizable unsaturated bonds.

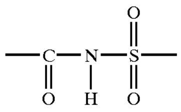

As such compounds, specifically, N-(p-toluene sulfonyl) methacrylamide, N-(p-toluene sulfonyl) acrylamide, and the like, can be preferably used.

In the alkaline water-soluble copolymer usable in the present invention, the monomers having the acidic groups (a-1) to (a-3) are not necessarily one kind, and those copolymers obtained by copolymerizing two or more kinds of monomers having the same acidic groups or two or more kinds of monomers having different acidic groups can also be used.

Copolymerization can be carried out using a method known in the art, such as graft copolymerization, block copolymerization, random copolymerization, or the like.

The alkaline water-soluble copolymer preferably contains, as copolymerization components, the monomers having the acidic groups (a-1) to (a-3) which are to be copolymerized in an amount of 10 mole % or more, and more preferably in an amount of 20 mole % or more. When the amount of the copolymerization components is less than 10 mole %, interaction with the resin having phenolic hydroxyl group is not sufficiently carried out, and the developing latitude is not sufficiently improved, although which improving effect is a merit of using the copolymerization components.

Further, the alkaline water-soluble copolymer may contain copolymerization components other than the monomers having the acidic groups (a-1) to (a-3).

Examples of other monomers usable as the copolymerization components include monomers listed in (1) to (12) below.

(1) Acrylates and methacrylates having aliphatic hydroxyl group such as 2-hydroxyethyl acrylate, 2-hydroxyethyl methacrylate, and the like.

(2) Alkyl acrylates such as methyl acrylate, ethyl acrylate, propyl acrylate, butyl acrylate, amyl acrylate, hexyl acrylate, octyl acrylate, benzyl acrylate, 2-chloroethyl acrylate, glycidyl acrylate, N-dimethylaminoethyl acrylate, and the like.

(3) Alkyl methacrylates such as methyl methacrylate, ethyl methacrylate, propyl methacrylate, butyl methacrylate, amyl methacrylate, hexyl methacrylate, cyclohexyl methacrylate, benzyl methacrylate, 2-chloroethyl methacrylate, glycidyl methacrylate, N-dimethylaminoethyl methacrylate, and the like.

(4) Acrylamides or methacrylamides such as acrylamide, methacrylamide, N-methylol acrylamide, N-ethyl acrylamide, N-hexyl methacrylamide, N-cyclohexyl acrylamide, N-hydroxyethyl acrylamide, N-phenyl acrylamide, N-nitrophenyl acrylamide, N-ethyl-N-phenyl acrylamide, and the like.

(5) Vinyl ethers such as ethyl vinyl ether, 2-chloroethyl vinyl ether, hydroxyethyl vinyl ether, propyl vinyl ether, butyl vinyl ether, octyl vinyl ether, phenyl vinyl ether, and the like.

(6) Vinyl esters such as vinyl acetate, vinyl chloroacetate, vinyl butyrate, vinyl benzoate, and the like.

(7) Styrenes such as styrene, -methyl styrene, methyl styrene, chloromethyl styrene, and the like.

(8) Vinyl ketones such as methyl vinyl ketone, ethyl vinyl ketone, propyl vinyl ketone, phenyl vinyl ketone, and the like.

(9) Olefins such as ethylene, propylene, isobutylene, butadiene, isoprene, and the like.

(10) N-vinyl pyrrolidone, N-vinyl carbazole, 4-vinyl pyridine, acrylonitrile, methacrylonitrile, and the like.

(11) Unsaturated imides such as maleimide, N-acryloyl acrylamide, N-acetyl methacrylamide, N-propionyl methacrylamide, N-(p-chlorobenzoyl) methacrylamide, and the like.

(12) Unsaturated carboxylic acids such as acrylic acid, methacrylic acid, maleic anhydride, itaconic acid, and the like.

In terms of film strength, the alkaline water-soluble polymer of the present invention preferably has a weight average molecular weight of 2000 or more and a number average molecular weight of 500 or more, regardless of whether it is a homopolymer or a copolymer. More preferably, the alkaline water-soluble polymer of the present invention has a weight average molecular weight of 5000 to 300000, a number average molecular weight of 800 to 250000, and a degree of dispersion (weight average molecular weight/number average molecular weight) of 1.1 to 10.

In terms of developing latitude, compounding ratio by weight of the monomers having the acidic groups (a-1) to (a-3) to other monomers in the alkaline water-soluble polymer is preferably in a range of 50:50 to 5:95, and more preferably in a range of 40:60 to 10:90.

Examples of the polymer having phenolic hydroxyl group preferable in the present invention include novolak resins such as polycondensates of mixed m- and p-cresol and formaldehyde, polycondensates of phenol, cresol and formaldehyde, and the like; N-(4-hydroxyphenyl)

methacrylamide/methyl methacrylate/acrylonitrile copolymer; 2-(N'-(4-hydroxyphenyl) ureido) ethylmethacrylate/methyl methacrylate/acrylonitrile copolymer; and the like.

The polymer having sulfonamide group preferable in the present invention includes N-(p-aminosulfonylphenyl) methacrylamide/methyl methacrylate/acrylonitrile copolymer, and the like; and the polymer having active imide group preferable in the present invention includes N-(p-toluenesulfonyl) methacrylamide/methyl methacrylate/acrylonitrile/2-hydroxyethyl methacrylate copolymer, and the like.

These alkaline water-soluble polymers may be used singly or in combination thereof, and the amount of the polymers to be added to the photosensitive layer is 30 to 99% by weight, preferably 40 to 95% by weight, and most preferably 50 to 90% by weight relative to the total solids in components forming the photosensitive layer. If the amount of the alkaline water-soluble polymer to be added is less than 30% by weight, the photosensitive layer becomes less durable. The amount exceeding 99% by weight is not preferable in terms of sensitivity and durability.

[Light-heat Converting Agent]

As described above, the planographic printing plate precursor of the present invention can be exposed by an infrared laser and contains the cyanine dye in the photosensitive layer thereof. However, other light-heat converting agents may be contained in the photosensitive layer from a standpoint of improving sensitivity to the exposure.

In the present invention, a light-heat converting agent contained in the photosensitive layer as desired can be any material which effects light-heat conversion, i.e., which generates heat when being exposed by an infrared laser. However, in terms of effect, a dye or a pigment which absorbs infrared ray and has a maximum absorption wavelength in a range of 760 nm to 1200 nm is preferable, and such a dye is most preferable in terms of image formability.

Pigments usable in the present invention include commercially available pigments and those described in Color Index (C.I.) Handbook; "Saishin Ganryo Binran" (Updated Pigment Handbook) edited by Nippon Ganryo Gijutsu Kyokai (Japan Pigment Technology Association), 1977; "Saishin Ganryo Oyo Gijutsu" (Advanced Pigment Application Technology), CMC Shuppan, 1986; and "Insatsu Inki Gijutsu" (Printing Ink Technology), CMC Shuppan, 1984.

Types of pigments include black pigments, yellow pigments, orange pigments, brown pigments, red pigments, violet pigments, blue pigments, green pigments, fluorescent pigments, metallic pigments, and other pigments such as polymer-binding pigments. Specifically, it is possible to use insoluble azo pigments, azo lake pigments, condensed azo pigments, chelate azo pigments, phthalocyanine type pigments, anthraquinone type pigments, perylene and perinone type pigments, thioindigo type pigments, quinacridone type pigments, dioxazine type pigments, isoindolinone type pigments, quinophthalone type pigments, dyed lake pigments, azine pigments, nitroso pigments, nitro pigments, natural pigments, fluorescent pigments, inorganic pigments, carbon black, and the like.

These pigments may be used with or without being subjected to surface treatments. Surface treatment methods include coating the surface of the pigment with resin or wax, adhering a surfactant to the surface of the pigment, coupling a reactive material (such as a silane coupling agent, an epoxy compound, a polyisocyanate, or the like) to the surface of the pigment, and the like. These surface treatment methods are described in "Kinzoku Sekken no Seishitsu to Oyo" (Properties and Application of Metallic Soap), Sachi Shobo; "Insatsu Inki Gijutsu" (Printing Ink Technology), CMC Shuppan, 1984; and "Saishin Ganryo Oyo Gijutsu" (Advanced Pigment Application Technology), CMC Shuppan, 1986.

Particle diameters of the pigments are preferably in a range of 0.0 1 m to 10 m, more preferably in a range of 0.05 m t o 1 m, and most preferably in a range of 0.1 m to 1 m. Particle diameters of less than 0.01 m are not preferable in terms of stability of dispersion in the photosensitive layer coating solution, and particle diameters exceeding 10 m are neither preferable in terms of uniformity of the photosensitive layer.

For dispersing the pigment, any known dispersion techniques used in production of inks or toners can be employed. Examples of dispersing machines are a supersonic disperser, a sand mill, an attritor, a pearl mill, a super mill, a ball mill, an impeller, a disperser, a KD mill, a colloid mill, a dynatron, a triple roll mill, a press kneader, and the like. Details are described in "Saishin Ganryo Oyo Gijutsu" (Advanced Pigment Application Technology), CMC Shuppan, 1986.

Dyes usable in the present invention include commercially available dyes and those known dyes described in literature, for example, "Senryo Binran" (Dye Handbook) edited by Yuki Gosei Kagaku Kyokai (Organic Synthetic Chemistry Association), 1970. Specific examples are azo dyes, metal complex salt azo dyes, pyrazolone azo dyes, anthraquinone dyes, phthalocyanine dyes, carbonium dyes, quinone imine dyes, methine dyes, cyanine dyes, diimonium dyes, aminium dyes, and the like.

Among these pigments or dyes, those absorbing infrared light or near infrared light are particularly preferable in the present invention since they are suitable for use with a laser emitting infrared or near infrared light.

Carbon black is preferably used as such a pigment for absorbing infrared or near infrared light. Examples of dyes absorbing infrared or near infrared light include cyanine dyes described in JP-A Nos. 58-125246, 59-84356, 59-202829, 60-78787, and the like, methine dyes described in JP-A Nos. 58-173696, 58-181690, 58-194595, and the like, naphthoquinone dyes described in JP-A Nos. 58-112793, 58-224793, 59-48187, 59-73996, 60-52940, 60-63744, and the like, squarylium dyes described in JP-A No. 58-112792, and the like, cyanine dyes described in GB Patent No. 434,875, and dihydropyrimidine squarylium dyes described in U.S. Pat. No. 5,380,635.

In addition, as the dye, a near infrared-absorbing sensitizer described in U.S. Pat. No. 5,556,938 can also be preferably used. Further, substituted aryl benzo(thio) pyrylium salts described in U.S. Pat. No. 3,881,924, trimethine thiapyrylium salts described in JP-A No. 57-142645 (U.S. Pat. No. 4,327,169), pyrylium type compounds described in JP-A Nos. 58-181051, 58-220143, 59-41363, 59-84248, 59-84249, 59-146063 and 59-146061, cyanine dyes described in JP-A No. 59-246146, pentamethine thiopyrylium salts and the like described in U.S. Pat. No. 4,283,475, pyrylium compounds disclosed in Japanese Patent Application Publication (JP-B) Nos. 5-13514 and 5-19702 are preferable. Among commercially available products, EPOLIGHT III-178, EPOLIGHT III-130, EPOLIGHT III-125, EPOLIGHT IV-62A, and the like, available from Epoline Co., Ltd. are particularly preferable.

These light-heat converting agents can be added in a ratio of 0.01 to 50% by weight, preferably 0.1 to 20% by weight, more preferably 0.5 to 15% by weight relative to the total solids in the photosensitive composition. Further, it is preferable to add them in a ratio of 1 to 50% by weight relative to an amount of the above-mentioned cyanine dye which is the main light-heat converting agent.

These dyes or pigments may be added into the photosensitive layer coating solution with other components, or may be added into a layer other than the photosensitive layer which may be provided upon producing the planographic printing plate precursors. These dyes or pigments may be used singly or in combination thereof.

[Other Components]

Further, various additives can be added as necessary to the photosensitive layer of the planographic printing plate precursor of the present invention. For example, other onium salts, aromatic sulfone compounds, aromatic sulfonate compounds, multifunctional amine compounds, or the like, are preferably added because they can improve the function of preventing the alkaline water-soluble polymer from being dissolved into the developing solution.

The onium salts include diazonium salts, ammonium salts, phosphonium salts, iodonium salts, sulfonium salts, selenonium salts, arsonium salts, and the like.

The onium salts are preferably added in an amount of 0.1 to 50% by weight, more preferably in an amount of 0.5 to 30% by weight, and most preferably in an amount of 1 to 10% by weight relative to the total solids in the material forming the photosensitive layer.

Furthermore, in order to improve sensitivity, cyclic acid anhydrides, phenols and organic acids can also be used in combination. Examples of cyclic acid anhydrides usable in the present invention include phthalic anhydride, tetrahydrophthalic anhydride, hexahydrophthalic anhydride, 3,6-endoxy-4-tetrahydrophthalic anhydride, tetrachlorophthalic anhydride, maleic anhydride, chloromaleic anhydride, -phenylmaleic anhydride, succinic anhydride, pyromellitic anhydride, and the like, described in U.S. Pat. No. 4,115,128. Examples of phenols include bisphenol A, p-nitrophenol, p-ethoxyphenol, 2,4,4'-trihydroxybenzophenone, 2,3,4-trihydroxybenzophenone, 4-hydroxybenzophenone, 4,4',4"-trihydroxytriphenylmethane, 4,4',3",4"-tetrahydroxy-3,5,3',5'-tetramehyltriphenylmethane, and the like. Examples of organic acids include sulfonic acids, sulfinic acids, alkyl sulfuric acids, phosphonic acids, phosphates, carboxylic acids, and the like described in JP-A Nos. 60-88942, 2-96755, and the like; and specific examples thereof include p-toluene sulfonic acid, dodecyl benzene sulfonic acid, p-toluene sulfinic acid, ethyl sulfuric acid, phenyl phosphonic acid, phenyl phosphinic acid, phenyl phosphate, diphenyl phosphate, benzoic acid, isophthalic acid, adipic acid, p-toluic acid, 3,4-dimethoxybenzoic acid, phthalic acid, terephthalic acid, 4-cyclohexene-1,2-dicarboxylic acid, erucic acid, lauric acid, n-undecanoic acid, ascorbic acid, and the like.

A ratio containing the cyclic acid anhydrides, phenols and/or organic acids in the photosensitive layer is preferably 0.05 to 20% by weight, more preferably 0.1 to 15% by weight, and most preferably 0.1 to 10% by weight relative to the total solids.

In order to provide stable processing under wider ranges of developing conditions, a nonionic surfactant such as described in JP-A Nos. 62-251740 and 3-208514, or an amphoteric surfactant such as described in JP-A Nos. 59-121044 and 4-13149 can be added into the photosensitive layer in the present invention.

Specific examples of nonionic surfactants include sorbitan tristearate, sorbitan monopalmitate, sorbitan trioleate, stearate monoglyceride, polyoxyethylene nonyl phenyl ether, and the like.

Specific examples of amphoteric surfactants include alkyl di(aminoethyl) glycine, alkyl polyaminoethyl glycine hydrochloride, 2-alkyl-N-carboxyethyl-N-hydroxyethyl imidazolium betaine, N-tetradecyl-N,N-betaine type surfactant (e.g., AMOGEN K™ available from Dai-Ichi Kogyo Co., Ltd.), and the like.

A ratio containing the nonionic surfactant and/or the amphoteric surfactant in the photosensitive layer coating solution is preferably 0.05 to 15% by weight, and more preferably 0.1 to 5% by weight.

A surfactant for improving coating properties, such as a fluorine type surfactant described in JP-A No. 62-170950, can be added into the photosensitive layer coating solution of the present invention. An amount of the fluorine type surfactant to be added is preferably 0.01 to 1% by weight, and more preferably 0.05 to 0.5% by weight relative to the total printing plate material.

A print-out agent for obtaining a visible image immediately after heating by exposure and/or dyes or pigments as image coloring agents can be added in the photosensitive layer of the present invention.

A typical example of the print-out agent is a combination of a compound which releases an acid when heated by exposure (optical acid releasing agent) and an organic dye which can form a salt. Specific examples include a combination of o-naphthoquinone diazide-4-sulfonate halogenide and a salt-forming organic dye as described in JP-A Nos. 50-36209 and 53-8128, and a combination of a trihalomethyl compound and a salt-forming organic dye as described in JP-A Nos. 53-36223, 54-74728, 60-3626, 61-143748, 61-151644 and 63-58440. The trihalomethyl compounds include oxazole type compounds and triazine type compounds, both of which are excellent in stability with time and give clear print-out images.

As the image coloring agent, other dyes besides the salt-forming organic dyes mentioned above can be used. Preferable dyes include oil-soluble dyes and basic dyes, as well as the salt-forming organic dyes. These dyes can be added into the printing plate material in a ratio of 0.01 to 10% by weight, preferably 0.1 to 3% by weight relative to the total solids in the printing plate material.

Further, a plasticizer is added as necessary into the photosensitive layer of the present invention in order to provide flexibility of the coating and the like. For example, polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, oligomer and polymer of acrylic acid or methacrylic acid, or the like can be used.

In addition, other materials such as epoxy compounds, vinyl ethers, phenol compounds having hydroxy methyl group described in JP-A No. 8-276558, phenol compounds having alkoxy methyl group, crosslinking compounds having alkali dissolution inhibiting action described in JP-A No. 11-160860 previously proposed by the present applicants, and the like, can be added as necessary depending on purposes.

The planographic printing plate precursor of the present invention can be produced by coating a suitable support with the photosensitive layer coating solution and other coating solutions each containing components for a desired layer such as a protection layer dissolved in a solvent. The coating solvent for the photosensitive layer is as described above. For other layers such as a protection layer and a back coat layer, a suitable solvent is selected from known solvents depending on components being used.

The support used for the planographic printing plate precursor of the present invention is a dimensionally stable plate, and examples thereof include paper, paper laminated with plastic (e.g., polyethylene, polypropylene, polystyrene, and the like), a metal plate (e.g., aluminum, zinc, copper, and the like), plastic film (e.g., diacetate cellulose, triacetate cellulose, propionate cellulose, butyrate cellulose, acetate butyrate cellulose, nitrate cellulose, polyethylene terephthalate, polyethylene, polystyrene, polypropylene, polycarbonate, polyvinyl acetal, and the like), paper or plastic film laminated or deposited with a metal such as listed above, and the like.

The support used for the planographic printing plate precursor of the present invention is preferably a polyester film or an aluminum plate, and the aluminum plate is particularly preferable among them because it is excellent in dimensional stability and is relatively inexpensive. The aluminum plate is preferably a pure aluminum plate or an aluminum alloy plate containing a very small amount of other elements, or may be a plastic film laminated or deposited with aluminum. Examples of other elements contained in the aluminum alloy include silicon, iron, manganese, copper, magnesium, chromium, zinc, bismuth, nickel, titanium, and the like. An amount of other elements contained in the alloy is up to 10% by weight. Aluminum particularly preferable in the present invention is pure aluminum, however, because of difficulty in producing 100% pure aluminum in respect of refining techniques, aluminum may contain a very small amount of other elements. Thus, composition of the aluminum plate used in the present invention is not particularly specified, and any suitable aluminum plates known and used conventionally can be used. Thickness of the aluminum plate used in the present invention is about 0.1 mm to 0.6 mm, preferably 0.15 mm to 0.4 mm, and most preferably 0.2 mm to 0.3 mm.

Prior to surface roughening of the aluminum plate, degreasing treatment for removing rolling oil from the surface using a surfactant, an organic solvent, an alkaline aqueous solution, or the like, is carried out as desired.

The surface roughening of the aluminum plate is effected by various methods, for example, mechanically roughening the surface, electrochemically dissolving and roughening the surface, and chemically and selectively dissolving the surface. For mechanically roughening the surface, a known method such as ball grinding, brush grinding, blast grinding, buff grinding, or the like, can be used. The electrochemical surface roughening can be effected, for example, in an electrobath containing hydrochloric acid or nitric acid by using altering current or direct current. Further, as described in JP-A No. 54-63902, a method combining both of them can be also used.

The aluminum plate subjected to the surface roughening is then subjected to alkali etching treatment and neutralization treatment as necessary, and is subjected to anodic oxidation, as desired, to improve water retention and abrasion resistance of the surface. The electrolyte used in the anodic oxidation of the aluminum plate can be selected from various electrolytes for forming a porous oxide film, and sulfuric acid, phosphoric acid, oxalic acid, chromic acid or mixed acid thereof is used in general. Concentration of the electrolyte is appropriately determined depending on the type of the electrolyte.

Conditions for the anodic oxidation varies depending on the electrolyte to be used and therefore cannot be specified, however, generally suitable ranges are: electrolyte concentration of 1 to 80% by weight solution, liquid temperature of 5 to 70° C., current density of 5 to 60 A/dm$^2$, voltage of 1 to 100 V, and electrolysis time of 10 seconds to 5 minutes.

When an amount of the anodic oxide film is less than 1.0 g/m$^2$, printing resistance becomes insufficient and the non-image portion of the planographic printing plate is easily scratched, and so-called "scratch staining" is likely to be caused by ink adhering to the scratch during printing.

After subjected to the anodic oxidation, the surface of the aluminum plate is subjected to a hydrophilization treatment as necessary. For the hydrophilization treatment in the present invention, an alkali metal silicate (e.g., aqueous sodium silicate solution) method as described in U.S. Pat. Nos. 2,714,066, 3,181,461, 3,280,734 and 3,902,734 can be used. In this method, the support is immersed or electrolyzed in an aqueous sodium silicate solution. Other methods such as a treatment using potassium fluorozirconate described in JP-B No. 36-22063, a treatment using polyvinyl phosphonic acid described in U.S. Pat. Nos. 3,276,868, 4,153,461, and 4,689,272, and the like can also be used.

The planographic printing plate precursor of the present invention is formed of the positive-type photosensitive layer, containing the photosensitive composition of the present invention, provided on the support, and an under coat layer may be provided under the photosensitive layer as necessary.

Various organic compounds can be used as under coat layer components, and examples thereof include carboxymethyl cellulose, dextrin, gum arabic, phosphonic acids having amino group such as 2-aminoethyl phosphonic acid, organic phosphonic acids such as phenyl phosphonic acid, naphthyl phosphonic acid, alkyl phosphonic acid, glycerophosphonic acid, methylene diphosphonic acid and ethylene diphosphonic acid which may be substituted, organic phosphoric acids such as phenyl phosphoric acid, naphthyl phosphoric acid, alkyl phosphoric acid and glycerophosphoric acid which may be substituted, organic phosphinic acids such as phenyl phosphinic acid, naphthyl phosphinic acid, alkyl phosphinic acid and glycerophosphinic acid which may be substituted, amino acids such as glycine and β-alanine, hydrochlorides of amine having hydroxy group such as hydrochloride of triethanol amine, and the like. These compounds may be used singly or in combination thereof.

The organic under coat layer can be provided in the following ways. One way is to coat a solution containing the above described organic compounds dissolved in water or in an organic solvent such as methanol, ethanol, methyl ethyl ketone, or the like, or combination thereof, on the aluminum plate and dry. Another way is to dip the aluminum plate in a solution containing the above described organic compounds dissolved in water or in an organic solvent such as methanol, ethanol, methyl ethyl ketone, or the like, or combination thereof to allow the above described compounds to be adsorbed onto the aluminum plate, and then wash the aluminum plate with water or the like, and dry. In the former way, the solution of the above-described organic compounds of a concentration of 0.005 to 10% by weight can be coated with various coating methods. In the latter way, concentration of the solution is 0.01 to 20% by weight, preferably 0.05 to 5% by weight, dipping temperature is 20 to 90° C., preferably 25 to 50° C., and dipping time is 0.1 second to 20 minutes, preferably 2 seconds to 1 minute. The solution may be adjusted in a range of pH 1 to 12 using a basic material such as ammonia triethylamine, potassium hydroxide, or the like, or an acidic material such as hydrochloric acid, phosphoric acid, or the like. A yellow dye may be added to improve the tone reproducibility of the image recording material.

An amount of the coating of the organic under coat layer is suitably 2 to 200 mg/m$^2$, and preferably 5 to 100 mg/m$^2$. If the amount of the coating is less than 2 mg/m$^2$, satisfactory printing resistance performance cannot be achieved. This is the same if the amount of the coating exceeds 200 mg/m$^2$.

The positive-type planographic printing plate precursor produced as described above is usually subjected to an image exposure and a development.

A light source of an active beam used for the image exposure includes a solid state laser, a semiconductor laser, or the like, which emits an infrared ray having a wavelength of 760 to 1200 nm.

In the present invention, the light source preferably has a light emission wavelength ranging from near infrared to infrared, and a solid state laser or a semiconductor laser is particularly preferable as the light source.

A conventionally known alkaline aqueous solution can be used as a developing solution and a replenishing solution for the planographic printing plate precursor of the present invention. For examples, aqueous solution of an inorganic alkali salt such as sodium silicate, potassium silicate, sodium tertiary phosphate, potassium tertiary phosphate, ammonium tertiary phosphate, sodium secondary phosphate, potassium secondary phosphate, ammonium secondary phosphate, sodium carbonate, potassium carbonate, ammonium carbonate, sodium hydrogencarbonate, potassium hydrogencarbonate, ammonium hydrogencarbonate, sodium borate, potassium borate, ammonium borate, sodium hydroxide, ammonium hydroxide, potassium hydroxide, lithium hydroxide, or the like can be used. In addition, aqueous solution of an organic alkali agent such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monisopropanolamine, diisopropanolamine, ethylene imine, ethylene diamine, pyridine, or the like can also be used.

These alkali agents are used singly or in combination thereof.

Among these alkali agents, aqueous solution of a silicate such as sodium silicate, potassium silicate, or the like, is particularly preferable as the developing solution. This is because the developing properties can be adjusted by ratio and concentration of silicon oxide ($SiO_2$) and alkaline metal oxide ($M_2O$) which are components of the silicate. Alkaline metal silicates such as described in JP-A No. 54-62004 and JP-B No. 57-7427 can be effectively used.

It is known that, when an automatic developing machine is used for development, a large number of PS plates can be processed without replacing a developing solution in a developing tank for a long time, by adding an aqueous solution (replenishing solution) which has higher alkali strength than the developing solution. This replenishing system is preferably applied in the present invention. Various surfactants and organic solvents can be added as necessary to the developing solution and to the replenishing solution in order to promote or suppress the developing properties, to disperse residues in development, and to enhance an affinity for ink of the image portion of the printing plate. Preferable surfactants include anionic, cationic, nonionic and amphoteric surfactants.

Further, reducing agent such as hydroquinone, resorcin, sodium or potassium salt etc. of an inorganic acid such as sulfurous acid and hydrogensulfinic acid, an organic carboxylic acid, a deforming agent and a hard-water softener can be added as necessary to the developing solution and the replenishing solution.

The printing plate which has been developed using the above described developing solution and replenishing solution is post-treated with washing water, a rinse containing a surfactant and the like, and a desensitizing solution containing gum arabic and a starch derivative. These treatments can be used in combination as the post-treatment of the image recording material of the present invention to be used as a printing plate.

In recent years, automatic developing machines for printing plates are widely used in the plate-making/printing industry for rationalizing and standardizing the plate making operation. The automatic developing machine generally consists of a developing section and a post-treatment section, and includes an device for conveying printing plates, baths containing respective treating solutions, and a spraying device. In this machine, each treating solutions is pumped and sprayed from a spray nozzle onto an exposed printing plate to develop the printing plate while the printing plate is conveyed horizontally. Recently, a method of dip-treating a printing plate in a treating solution bath filled with a treating solution while transferring it by use of guide rolls into the solution has become known. In such an automatic processing, treatments can be carried out while replenishing the replenishing solutions to each of treating solutions depending on throughput, operation time, and the like.

Further, so-called "throwaway" processing system where treatments are carried out using substantially unused treating solutions is also applicable.

Next, the photosensitive planographic printing plate precursor employing the photosensitive composition of the present invention is described. If an unnecessary image portion (such as a trace of an edge of an original image film) is present on a planographic printing plate obtained through image exposure, development, washing with water, rinsing and/or gum coating, the unnecessary image portion is erased. Such erasing is preferably carried out by applying an erasing solution such as described in JP-B No. 2-13293 onto the unnecessary image portion, leaving it for a predetermined time, and washing it with water. However, a method in which the unnecessary portion is exposed by an active beam guided by an optical fiber and then is developed, such as described in JP-A No. 59-174842, can also be used.

The planographic printing plate obtained as described above is coated with a desensitizing gum as necessary, and then can be used for printing. However, if the planographic printing plate is desired to have higher printing resistance, the planographic printing plate is subjected to a burning treatment.

When the planographic printing plate is subjected to the burning treatment, the planographic printing plate is preferably treated with a baking conditioner such as described in JP-B Nos. 61-2518 and 55-28062, and JP-A Nos. 62-31859 and 61-159655, prior to the burning treatment.

The baking conditioner may be applied onto the planographic printing plate by using a sponge or absorbent cotton impregnated with the baking conditioner, or by dipping the printing plate in a vat filled with the baking conditioner, or by an automatic coater. Further, the baking conditioner applied onto the printing plate may be evenly spread with squeegee or squeezing rollers to give a better result.

A suitable amount of the baking conditioner to be applied is generally 0.03 to 0.8 $g/m^2$ (dry weight).

The planographic printing plate which has been coated with the baking conditioner and dried as necessary is then heated to a high temperature with a burning processor (e.g., a burning processor BP-1300 available from Fuji Photo Film Co., Ltd.) or the like. Heating temperature and heating time at this time depend on the types of components forming an image, however, are preferably in ranges of 180 to 300° C. and 1 to 20 minutes.

The planographic printing plate which has been subjected to the burning treatment may be subjected to conventional treatments such as washing with water, gum coating, and the like, as necessary. However, if the baking conditioner contains a water-soluble polymer and the like, so-called desensitization such as gum coating can be omitted.

The planographic printing plate obtained through above described treatments is set into an offset printer or the like to be used for printing onto a multitude of sheets.

EXAMPLES

Hereinafter, the present invention is described in accordance with Examples, which however are not intended to limit the present invention.

Example 1

Preparation of Support

A 0.3 mm-thick aluminum plate (material 1050) was washed with trichloroethylene for degreasing, and the surface thereof was grained with a nylon brush and a suspension of 400 mesh pumice stone powder in water, and then washed sufficiently with water. The plate was etched by being immersed in 25% aqueous sodium hydroxide solution at 45° C. for 9 seconds and washed with water, and then further immersed in 20% nitric acid for 20 seconds and washed with water. The amount of etching of the grained surface at this time was about 3 $g/m^2$. Next, the plate was provided with an AC anodic oxide film of 3 $g/m^2$ using 7% sulfuric acid as an electrolyte and at a current density of 15 $A/dm^2$, and then washed with water and dried.

Then, the plate was treated with 2.5% by weight aqueous sodium silicate solution at 30° C. for 10 seconds, and was coated with an under coat solution described below and dried at 80° C. for 15 seconds to obtain a support. The amount of the coating was 15 $mg/m^2$ in dry weight.

<Composition of Under Coat Solution>

| | |
|---|---|
| Copolymer shown below having molecular weight of $2.8 \times 10^4$ | 0.3 g |
| Methanol | 100 g |
| Water | 1 g |

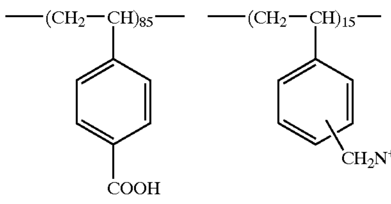

The obtained support was coated with a photosensitive layer coating solution 1 described below at an amount of coating of 1.8 $g/m^2$, and was dried to obtain a planographic printing plate precursor of Example 1.

<Composition of Photosensitive Layer Coating Solution 1>

| | |
|---|---|
| m,p-cresol novolak (m/p ratio = 6/4, having weight average molecular weight of 8000, containing 0.5% by weight of unreacted cresol) | 1.0 g |
| Cyanine dye A (having the structure shown below) | 0.1 g |
| tetrahydrophthalic acid anhydride | 0.05 g |

-continued

| | |
|---|---|
| p-toluenesulfonic acid | 0.002 g |
| Counter ion of ethyl violet made into 6-hydroxy-β-naphthalene sulfonic acid | 0.02 g |
| Fluorine type surfactant (MEGAFAC F-177, available from Dainippon Ink and Chemicals, Inc.) | 0.02 g |
| Methyl ethyl ketone (boiling point: 79.6° C.) | 12 g |

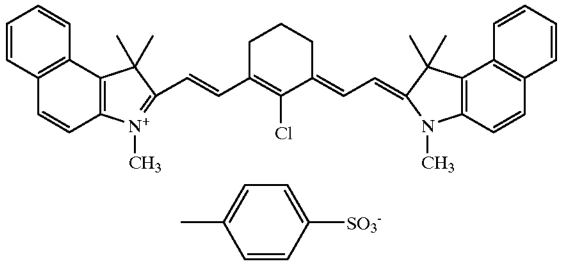

Cyanine dye A

Examples 2 to 7, Comparative Examples 1 to 6

Planographic printing plates of Examples 2 to 7 and Comparative Examples 1 to 6 were prepared in the same manner as Example 1 except that the thickness of the aluminum plate, as well as the light-heat converting agent (cyanine dye A) and the solvent (methyl ethyl ketone having a boiling point of 79.6° C.) used in the photosensitive layer coating solution 1 were changed as shown in Table 1 below.

Compositions of cyanine dye B and cyanine dye C used as the light-heat converting agent in Examples, and pyrylium dye A and carbon black dispersion used as the light-heat converting agent in Comparative Examples are shown below.

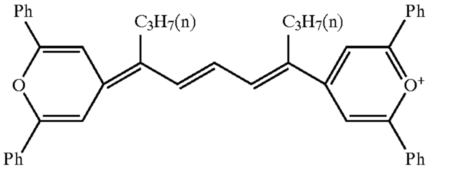

Pyrylium dye A

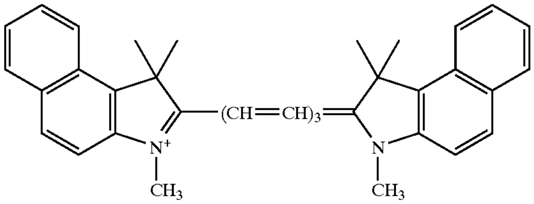

$ClO_4^-$

Cyanine dye B

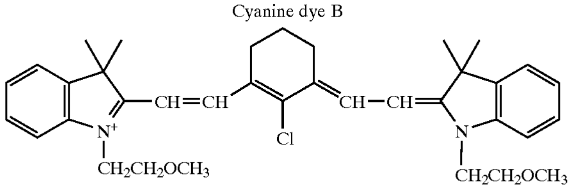

$BF_4^-$

Cyanine dye C

<Composition of Carbon Black Dispersion>

| | |
|---|---|
| Carbon black | 1 part by weight |
| Copolymer of benzylmethacrylate and methacrylic acid (mole ratio 72:28, Mw 7 × $10^4$) | 1.6 parts by weight |
| Cyclohexanone | 1.6 parts by weight |
| Methoxypropyl acetate | 3.8 parts by weight |

Composition of Alkaline Developing Solution C

| | |
|---|---|
| $SiO_2$ $K_2O$ ($K_2O/SiO_2$ = 1.1 (mole ratio)) | 4.0% by weight |
| Citric acid | 0.5% by weight |
| Polyethylene glycol (weight average molecular weight = 1000) | 0.5% by weight |
| Water | 95.0% by weight |

TABLE 1

| | Thickness of Aluminum Support (mm) | Light-heat Converting Agent | Solvent | Residual Solvent ($mg/m^2$) methyl ethyl ketone | methanol | 1-methoxy-2-propanol | Percentage Content of Solvent Lower than 100% | Clear Sensitivity ($mJ/cm^2$) |
|---|---|---|---|---|---|---|---|---|
| Ex. 1 | 0.3 | cyanine dye A 0.1 g | methyl ethyl ketone 12 g | 35 | — | — | 100% | 63 |
| Ex. 2 | 0.2 | cyanine dye A 0.1 g | methyl ethyl ketone 12 g | 34 | — | — | 100% | 63 |
| Ex. 3 | 0.4 | cyanine dye A 0.1 g | methyl ethyl ketone 12 g | 38 | — | — | 100% | 63 |
| Ex. 4 | 0.2 | cyanine dye B 0.15 g | methyl ethyl ketone 6 g methanol 6 g | 30 | 4 | — | 100% | 70 |
| Ex. 5 | 0.4 | cyanine dye B 0.15 g | methyl ethyl ketone 6 g methanol 6 g | 33 | 5 | — | 100% | 70 |
| Ex. 6 | 0.2 | cyanine dye C 0.07 g | methyl ethyl ketone 11.5 g 1-methoxy-2-propanol 0.5 g | 25 | — | 8 | 76% | 78 |
| Ex. 7 | 0.4 | cyanine dye C 0.07 g | methyl ethyl ketone 11.5 g 1-methoxy-2-propanol 0.5 g | 28 | — | 10 | 74% | 70 |
| Com. 1 | 0.2 | cyanine dye A 0.1 g | methyl ethyl ketone 8 g 1-methoxy-2-propanol 4 g | 1 | — | 52 | 2% | 86 |
| Com. 2 | 0.4 | cyanine dye A 0.1 g | methyl ethyl ketone 8 g 1-methoxy-2-propanol 4 g | 1 | — | 70 | 1% | 47 |
| Com. 3 | 0.2 | pyrylium dye A 0.1 g | methyl ethyl ketone 12 g | 35 | — | — | 100% | 94 |
| Com. 4 | 0.4 | pyrylium dye A 0.1 g | methyl ethyl ketone 12 g | 40 | — | — | 100% | 78 |
| Com. 5 | 0.2 | carbon black dispersion 0.4 g | methyl ethyl ketone 12 g | 33 | — | — | 100% | 126 |
| Com. 6 | 0.4 | carbon black dispersion 0.4 g | methyl ethyl ketone 12 g | 41 | — | — | 100% | 94 |

Performance Evaluation of Planographic Printing Plate Precursor

For each of the planographic printing plate precursors of Examples 1 to 7 and Comparative Examples 1 to 6 prepared as described above, first, amounts of residual solvents in the photosensitive layer were measured by gas chromatograph method, and a ratio of the solvent having the boiling point lower than 100° C. in the solvent having the boiling point lower than 200° C. was calculated, and then performance was evaluated in accordance with criteria described below. The amounts of the residual solvents, the percentage contents of the solvent having the boiling point lower than 100° C. and results of the evaluation are contained in Table 1.

20 liters of an alkaline developing solution C (pH of about 13) of a composition described below was poured into a developing bath of a commercially available automatic developing machine LP-900H (manufactured by Fuji Photo Film Co., Ltd.) having dipping-type developing baths, and was kept at 30° C. The second bath of the LP-900 H was filled with 8 liters of tap water, and the third bath was filled with 8 liters of FP-2W finishing gum solution (produced by Fuji Photo Film Co., Ltd.) diluted by water at 1:1.

The planographic printing plate precursors were exposed using a plate setter, TRENDSETTER 3244F available from Creo (revolution speed 150 rpm), and were developed.

The exposure was carried out while the power was increased in 0.5W increments from 2W, and clear sensitivity was calculated, by an equation below, from the minimum power with which the development could be carried out without leaving residual films. The results are contained in Table 1.

$$\text{Clear Sensitivity } (mJ/cm^2)=[2350\times(\text{Minimum Power})]/150$$

From the results contained in Table 1, it was found that all the planographic printing plate precursors of the present invention, which employed the cyanine dyes represented by general formula (I) as the light-heat converting agent and the coating solvent system containing 80% by weight or more of the solvent having the boiling point lower than 100° C., had high sensitivity, and variation of sensitivity thereof depending on the thickness of the aluminum support was small, thereby achieving stable developing properties.

On the other hand, the planographic printing plate precursors of Comparative Examples 1 and 2 using the solvent system containing 33% by weight of 1-methoxy-2-propanol (boiling point 120.6) and the planographic printing plate precursors of Comparative Examples 2 to 6 using the dye or pigment other than the cyanine dye of the present invention as the light-heat converting agent had large variation in sensitivity depending on the thickness of the aluminum support, in turn, large variation in developing properties thereof. Therefore, they were not suitable for actual use.

The planographic printing plate precursor of the present invention can be recorded by an infrared laser exposure, has high sensitivity and is excellent in image formability. Even when the thickness of the support is changed, the planographic printing plate precursor of the present invention still maintains the same sensitivity, and therefore is excellent in developing stability.

What is claimed is:

1. A positive-type planographic printing plate precursor comprising:

a photosensitive layer as a top layer and obtained by coating and drying on a support a photosensitive layer coating solution formed of a photosensitive composition, which contains a cyanine dye represented in the following general formula (I) and a polymer insoluble in water and soluble in an aqueous alkali solution, dissolved or dispersed in a solvent system, which includes a solvent having a boiling point lower than 200° C., wherein 80% by weight or more of the solvent consists of a solvent having a boiling point lower than 100°;

wherein a solubility in an aqueous alkali solution of the photosensitive layer is increased by an infrared laser exposure:

General formula (I)

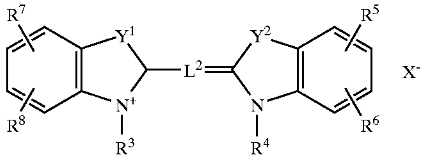

wherein, each of $Y^1$ and $Y^2$ represents a dialkylmethylene group or a sulfur atom; each of $R^3$ and $R^4$ represents an alkyl group, alkenyl group, alkynyl group or phenyl group which may be substituted; $L^2$ represents a trimethine group, pentamethine group or heptamethine group which may be substituted, and two substituents of the pentamethine group or the heptamethine group may be combined with each other to form a cycloalkene ring having 5 to 7 carbon atoms; each of $R^5$ through $R^8$ represents a hydrogen atom or an alkyl group, alkenyl group, alkoxy group, cycloalkyl group or aryl group which may be substituted, and $R^5$ and $R^6$, and $R^7$ and $R^8$ may be combined with each other to form a ring structure; and $X^-$ represents an anion wherein of the residual solvent contained in the photosensitive layer 50% by weight or more of the solvent consists of solvent having a boiling point lower than 100°.

2. A positive-type planographic printing plate precursor according to claim 1, wherein of the residual solvent contained in the photosensitive layer 70% by weight or more of the solvent consists of a solvent having a boiling point lower than 100°.

3. A method for producing a positive-type planographic printing plate precursor comprising the steps of:

preparing a photosensitive composition containing a cyanine dye represented in the following general formula (I) and a polymer insoluble in water and soluble in an aqueous alkali solution;

preparing a photosensitive layer coating solution by dissolving or dispersing the photosensitive composition in a solvent system which includes a solvent having a boiling point lower than 200° C., wherein 80% by weight or more of the solvent consists of a solvent having a boiling point lower than 100°; and coating and drying the photosensitive layer coating solution on a support to form a photosensitive layer as a top layer:

General formula (I)

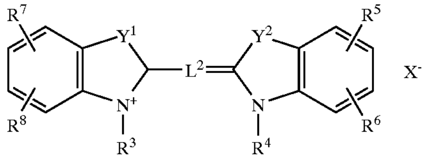

wherein, each of $Y^1$ and $Y^2$ represents a dialkylmethylene group or a sulfur atom; each of $R^3$ and $R^4$ represents an alkyl group, alkenyl group, alkynyl group or phenyl group which may be substituted; $L^2$ represents a trimethine group, pentamethine group or heptamethine group which may be substituted, and two substituents of the pentamethine group or the heptamethine group may be combined with each other to form a cycloalkene ring having 5 to 7 carbon atoms; each of $R^5$ through $R^8$ represents a hydrogen atom or an alkyl group, alkenyl group, alkoxy group, cycloalkyl group or aryl group which may be substituted, and $R^5$ and $R^6$, and $R^7$ and $R^8$ may be combined with each other to form a ring structure; and $X^-$ represents an anion wherein of the residual solvent contained in the photosensitive layer 50% by weight or more of the solvent consists of a solvent having a boiling point lower than 100°.

4. A method for producing a positive-type planographic printing plate precursor according to claim 3, wherein of the residual solvent contained in the photosensitive layer 70% by weight or more of the solvent consists of a solvent having a boiling point lower than 100°.

* * * * *